(12) United States Patent
Jang et al.

(10) Patent No.: US 12,204,204 B2
(45) Date of Patent: Jan. 21, 2025

(54) DISPLAY DEVICE

(71) Applicant: SAMSUNG ELECTRONICS CO., LTD., Suwon-si (KR)

(72) Inventors: Hyukjun Jang, Suwon-si (KR); Kyehoon Lee, Suwon-si (KR); Youngmin Lee, Suwon-si (KR); Yonghun Kwon, Suwon-si (KR); Sunyoung Kim, Suwon-si (KR); Hyungsuk Kim, Suwon-si (KR); Seungyong Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/666,227

(22) Filed: May 16, 2024

(65) Prior Publication Data

US 2024/0302694 A1 Sep. 12, 2024

Related U.S. Application Data

(63) Continuation of application No. PCT/KR2022/019958, filed on Dec. 8, 2022.

(30) Foreign Application Priority Data

Jan. 28, 2022 (KR) .......................... 10-2022-0013432

(51) Int. Cl.
*G02F 1/13357* (2006.01)
*G02F 1/1335* (2006.01)

(52) U.S. Cl.
CPC .. *G02F 1/133603* (2013.01); *G02F 1/133608* (2013.01); *G02F 1/133612* (2021.01)

(58) Field of Classification Search
CPC ............................................... G02F 1/133608
(Continued)

(56) References Cited

U.S. PATENT DOCUMENTS 6,356,451 B1 3/2002 Nakagawa et al.
6,633,488 B1 10/2003 Morita
(Continued)

FOREIGN PATENT DOCUMENTS

JP 2000-124612 A 4/2000
JP 2000-252650 A 9/2000
(Continued)

OTHER PUBLICATIONS

International Search Report (PCT/ISA/210) issued on Mar. 28, 2023 by the International Searching Authority in International Patent Application No. PCT/KR2022/019958.
(Continued)

*Primary Examiner* — Charles S Chang
(74) *Attorney, Agent, or Firm* — Sughrue Mion, PLLC

(57) ABSTRACT

A display device includes: a display panel; a light source module on a rear side of the display panel and configured to generate light supplied to the display panel, the light source module including a plurality of light sources configured to emit light and a printed circuit board (PCB) on which the plurality of light sources are provided; and a bottom chassis on a rear side of the light source module and on which the light source module is provided, wherein the PCB includes: an insulating layer, a first conductive layer on a lower surface of the insulating layer, and a second conductive layer on an upper surface of the insulating layer, and an area of the second conductive layer is smaller than an area of the first conductive layer, and the PCB is convexly bent in a direction toward the display panel.

8 Claims, 10 Drawing Sheets

(58) Field of Classification Search
USPC .................................................... 349/61–71
See application file for complete search history.

(56) References Cited

U.S. PATENT DOCUMENTS

| | | | |
|---|---|---|---|
| 7,976,210 B2 * | 7/2011 | Shinozaki | G02F 1/133603 |
| | | | 362/249.02 |
| 2012/0300457 A1 | 11/2012 | Jeong et al. | |
| 2013/0242520 A1 | 9/2013 | Onozuka | |

FOREIGN PATENT DOCUMENTS

| | | |
|---|---|---|
| JP | 3260224 B2 | 2/2002 |
| JP | 2012-124460 A | 6/2012 |
| JP | 2013-187221 A | 9/2013 |
| JP | 5938953 B2 | 6/2016 |
| JP | 2020-71980 A | 5/2020 |
| KR | 10-2000-0075058 A | 12/2000 |
| KR | 10-2010-0131754 A | 12/2010 |
| KR | 10-2012-0116945 A | 10/2012 |
| KR | 10-1748237 B1 | 6/2017 |
| WO | 2019/069744 A1 | 4/2019 |

OTHER PUBLICATIONS

Written Opinion (PCT/ISA/237) issued on Mar. 28, 2023 by the International Searching Authority in International Patent Application No. PCT/KR2022/019958.

* cited by examiner

DISPLAY DEVICE

CROSS-REFERENCE TO RELATED APPLICATION(S)

This application is a continuation n of International Application No. PCT/KR2022/019958, filed on Dec. 8, 2022, in the Korean Intellectual Property Receiving Office, which is based on and claims priority to Korean Patent Application No. 10-2022-0013432, filed on Jan. 28, 2022, in the Korean Intellectual Property Office, the disclosures of which are incorporated by reference herein in their entireties.

BACKGROUND

1. Field

The disclosure relates to a display device in which a printed circuit board is bent uniformly in one direction by thermal expansion after a reflow process.

2. Description of Related Art

In general, display devices convert acquired or stored electrical information into visual information and display such information to a user, and are used in various fields, such as homes and businesses.

Display devices may include monitor devices connected to personal computers (PCs) or server computers, portable computing devices, navigation terminal devices, conventional televisions (TVs), internet protocol television (IPTV) devices, handheld terminal devices such as smart phones, tablet PCs, personal digital assistants (PDAs), or cellular phones, various display devices used in industry to play images such as advertisements or moves, various types of audio/video systems, and the like.

A display device, for converting electrical information into visual information, may include a light source module, and the light source module may include a plurality of light sources for independently emitting light.

Each of the plurality of light sources may include, for example, a light emitting diode (LED) or an organic light emitting diode (OLED). For example, the LED or the OLED may be mounted on a printed circuit board (PCB) using surface mount technology (SMT).

After undergoing a reflow process to mount the plurality of light sources, the PCB may be distorted due to thermal expansion. Such distortion may result in cause non-uniform image quality and the appearance of mura at the plate boundary when the PCB is assembled to a bottom chassis.

SUMMARY

Provided is a display device in which conductive layers formed on upper and lower surfaces of a PCB have different areas to ensure that the PCB is bent uniformly in one direction due to thermal expansion after undergoing a reflow process.

Additional aspects will be set forth in part in the description which follows and, in part, will be apparent from the description, or may be learned by practice of the presented embodiments.

According to an aspect of the disclosure, a display device includes: a display panel; a light source module on a rear side of the display panel and configured to generate light supplied to the display panel, the light source module including a plurality of light sources configured to emit light and a printed circuit board (PCB) on which the plurality of light sources are provided; and a bottom chassis on a rear side of the light source module and on which the light source module is provided, wherein the PCB includes: an insulating layer, a first conductive layer on a lower surface of the insulating layer, and a second conductive layer on an upper surface of the insulating layer, and an area of the second conductive layer is smaller than an area of the first conductive layer, and the PCB is convexly bent in a direction toward the display panel.

A central portion of the PCB may be bent toward the display panel and an edge portion of the PCB may be bent toward the bottom chassis.

Each of the first conductive layer and the second conductive layer may include copper.

The first conductive layer may form 90% of an area of a lower surface of the PCB.

The second conductive layer may form 70% to 90% of an area of an upper surface of the PCB.

The second conductive layer may form 77% of the area of the upper surface of the PCB.

The second conductive layer may form 83% of the area of the upper surface of the PCB.

At least a portion of the second conductive layer may be cut away such that an area of a remaining portion of the second conductive layer is smaller than the area of the first conductive layer.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
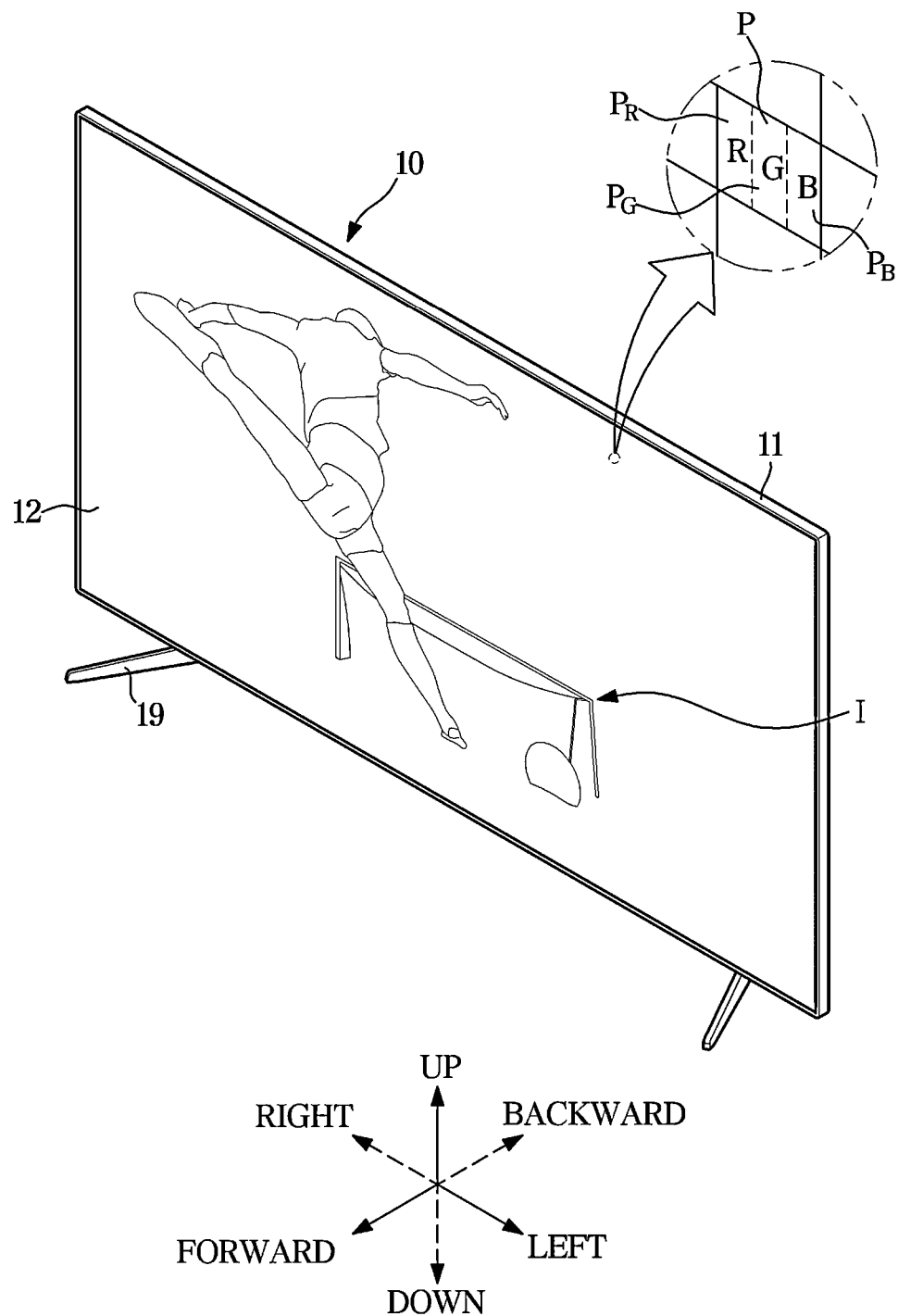
FIG. 1 is a view illustrating an exterior of a display device according to an embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", "comprising" and the like are used to specify features, figures, steps, operations, elements, components, or combinations thereof, but do not preclude the presence or addition of one or more of the features, figures, steps, operations, elements, components, or combinations thereof.

It will be understood that, although the terms "first", "second", "primary", "secondary", etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "or" includes a plurality of combinations of relevant items or any one item among a plurality of relevant items.

Further, as used herein, the term "part", "module", "member", or "block" may be implemented in software or hardware, and in accordance with embodiments, a plurality of "parts", "modules", "members", or "blocks" may be implemented as a single component, or a single "part", "module", "member", or "block" may comprise a plurality of elements.

Throughout the specification, when a part is referred to as being "connected" to another part, this may include not only direct connection, but also indirect connection, and indirect connection may include connection via a wireless communication network.

When the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

When a component is referred to as being "on" or "over" another component, it can be directly on the other component or intervening components may also be present.

Embodiments of the present disclosure will be described in detail below with reference to the accompanying drawings.

FIG. 1 is a view illustrating an exterior of a display device according to an embodiment.

A display device 10 may be a device capable of processing an image signal received from an external source and visually displaying the processed image. In the following, the display device 10 is described in the case where the display device 10 is a television (TV), but embodiments of the disclosure are not limited thereto. For example, the display device 10 may be implemented in various forms, such as a monitor, a portable multimedia device, and a portable communication device, and the like, and may have any form as long as it is a device that visually displays an image (e.g., picture, video).

Furthermore, the display device 10 may be a large format display (LFD) installed outdoors, such as on a roof of a building or at a bus stop. Here, the outdoors may not be necessarily limited to any outdoor location, and the display device 10 according to an embodiment may be installed in any location where a large number of people may come and go even if indoors, such as a subway station, a shopping mall, a movie theater, a company, a store, or the like.

The display device 10 may receive content data including video data and audio data from various content sources, and may output video and audio corresponding to the video data and audio data. For example, the display device 10 may receive content data via a broadcast reception antenna or a wired cable, receive content data from a content playback device, or receive content data from a content delivery server of a content provider.

As shown in FIG. 1, the display device 10 may include a main body 11, a screen 12 displaying an image I, and a support 19 provided at a lower portion of the main body 11 to support the main body 11.

The main body 11 may form the exterior of the display device 10, and the interior of the main body 11 may be provided with components for the display device 10 to display the image I and/or perform various functions. The main body 11 shown in FIG. 1 may have a flat plate shape, but the shape of the main body 11 is not limited to that shown in FIG. 1. For example, the main body 11 may have a curved plate shape.

The screen 12 may be formed on a front side of the main body 11 and may display the image I. For example, the screen 12 may display a still image or a video. In addition, the screen 12 may display a two-dimensional (2D) flat image or a three-dimensional (3D) stereoscopic image using the parallax between the user's two eyes.

A plurality of pixels P may be formed on the screen 12, and the image I displayed on the screen 12 may be formed by light emitted from each of the plurality of pixels P. For example, the image I may be formed on the screen 12 by combining the light emitted from the plurality of pixels P, such as in a mosaic.

Each of the plurality of pixels P may emit light of different brightness and different colors. For example, each of the plurality of pixels P may include a self-emissive panel (e.g., a light-emitting diode (LED) panel) capable of directly emitting light, or a non-emissive panel (e.g., a display panel) capable of passing through or blocking light emitted from a light source device, or the like.

To emit light of different colors, each of the plurality of pixels P may include sub-pixels.

The sub-pixels may include a red sub-pixel (PR) capable of emitting red light, a green sub-pixel (PG) capable of emitting green light, and a blue sub-pixel (PB) capable of emitting blue light. For example, the red light may represent light having a wavelength of about from 620 nm (one billionth of a meter) to 750 nm, the green light may represent light having a wavelength of about from 495 nm to 570 nm, and the blue light may represent light having a wavelength of about from 450 nm to 495 nm.

By combining the red light of the PR, the green light of the PG, and the blue light of the PB, light of various brightness and various colors may be emitted from each of the plurality of pixels P.

Figure 2:
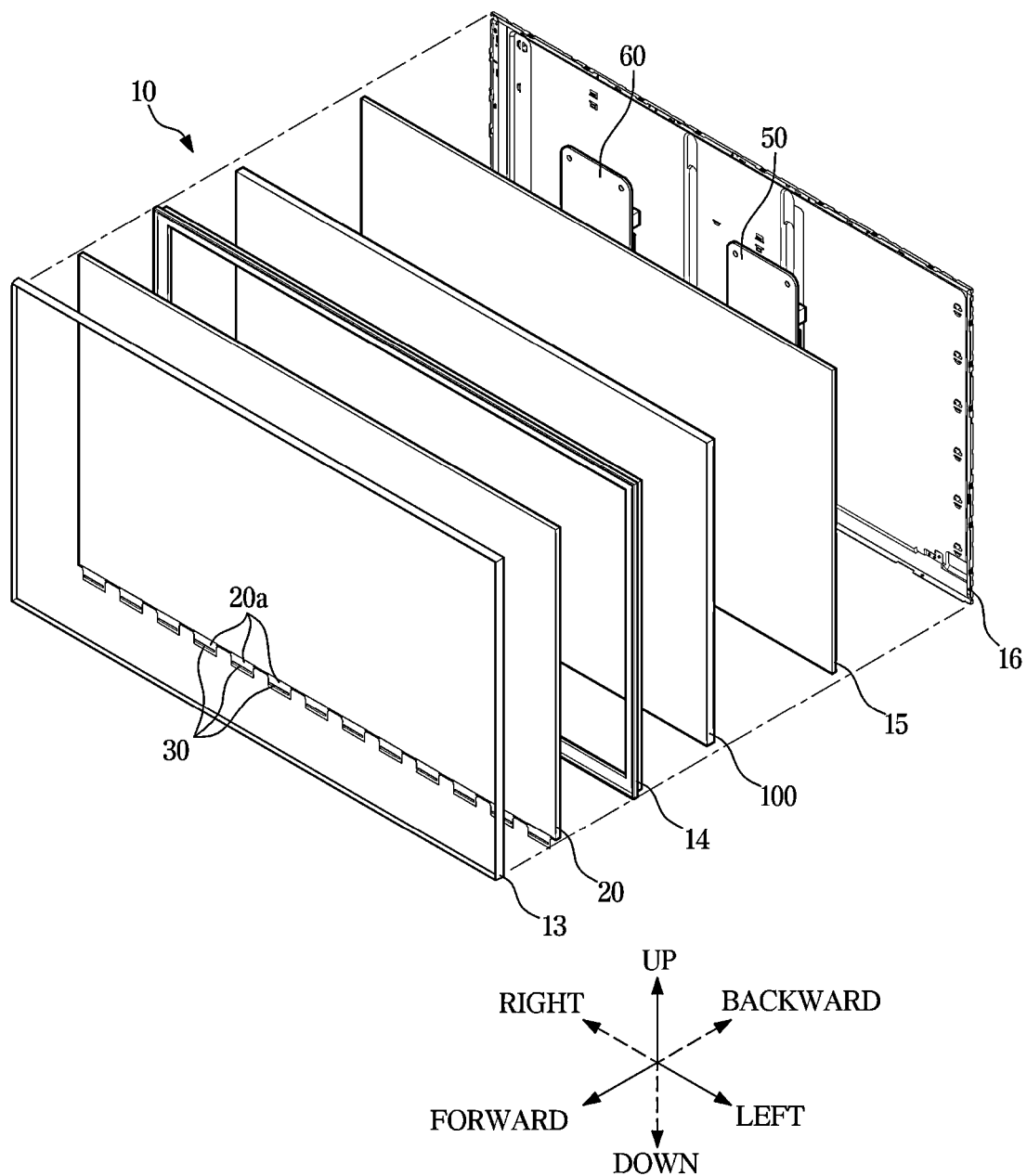
FIG. 2 is an exploded view of the display device shown in FIG. 1 according to an embodiment.

FIG. 2 is an exploded view of the display device shown in FIG. 1.

As shown in FIG. 2, various components for generating the image I on the screen S may be arranged within the main body 11 (see FIG. 1).

For example, the main body 11 (see FIG. 1) may include a light source device 100 that is a surface light source, a display panel 20 that blocks or transmits light emitted from the light source device 100, a control assembly 50 that controls an operation of the device 100 and the display panel 20, and a power assembly 60 that supplies power to the light source device 100 and the display panel 20. In addition, the main body 11 may include a bezel 13, a frame middle mold 14, a bottom chassis 15, and a back cover 16 for supporting and securing the display panel 20, the light source device 100, the control assembly 50, and the power assembly 60.

The light source device 100 may include a point light source that emits monochromatic light or white light, and may refract, reflect, and scatter the light so as to convert the light emitted from the point light source into a uniform surface light. For example, the light source device 100 may include a plurality of light sources that emit monochromatic light or white light, a diffuser plate that diffuses light incident from the plurality of light sources, a diffuser late that diffuses light incident from the plurality of light sources, a reflective sheet that reflects light emitted from the plurality of light sources and a rear surface of the diffuser plate, and an optical sheet that refracts and scatters light emitted from a front surface of the diffuser plate.

As such, the light source device 100 may emit uniform surface light toward the front by refracting, reflecting, and scattering light emitted from the light sources.

Figure 3:
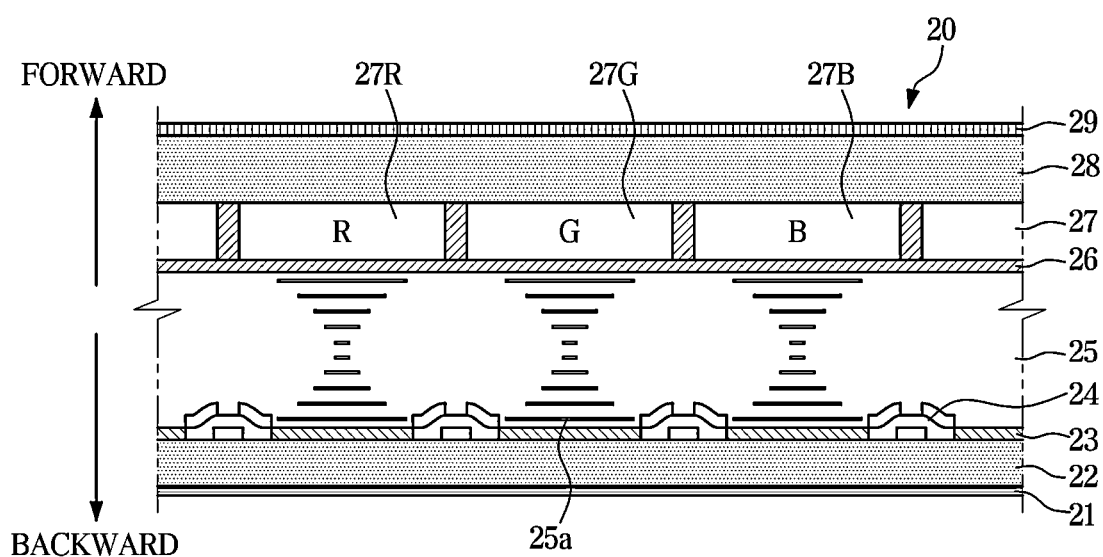
FIG. 3 is a side cross-sectional view of a display panel in the display device shown in FIG. 2 according to an embodiment.

FIG. 3 is a side cross-sectional view of the display panel in the display device shown in FIG. 2.

The display panel 20 may be disposed on a front side of the light source device 100 and may block or transmit light emitted from the light source device 100 to form the image I.

The front surface of the display panel 20 may form the screen 12 of the display device 10 described above, and the display panel 20 may form the plurality of pixels P. The plurality of pixels P may each independently block or pass light from the light source device 100, and the light passed by the plurality of pixels P may form the image I displayed on the screen 12.

For example, as shown in FIG. 3, the display panel 20 may include a first polarizing film 21, a first transparent substrate 22, a pixel electrode 23, a thin film transistor (TFT) 24, and a liquid crystal layer 25, a common electrode 26, a color filter 27, a second transparent substrate 28, and a second polarizing film 29.

The first transparent substrate 22 and the second transparent substrate 28 may securely support the pixel electrode 23, the TFT 24, the liquid crystal layer 25, the common electrode 26, and the color filter 27. The first and second transparent substrates 22 and 28 may be formed of tempered glass or transparent resin.

On outer sides of the first and second transparent substrates 22 and 28, the first polarizing film 21 and the second polarizing film 29 may be provided.

The first polarizing film 21 and the second polarizing film 29 may each allow certain light to pass through and block other light. For example, the first polarizing film 21 may allow light having a magnetic field oscillating in a first direction to pass through and block other light. In addition, the second polarizing film 29 may allow light having a magnetic field oscillating in a second direction to pass through and block other light. In this case, the first direction and the second direction may be perpendicular to each other.

As a result, a polarization direction of the light passed through the first polarizing film 21 and an oscillation direction of the light passed through the second polarizing film 29 may be perpendicular to each other. Accordingly, light may generally not pass through the first polarizing film 21 and the second polarizing film 29 simultaneously.

The color filter 27 may be disposed on an inner side of the second transparent substrate 28.

The color filter 27 may include, for example, a red filter 27R that passes red light, a green filter 27G that passes green light, and a blue filter 27B that passes blue light. The red filter 27R, the green filter 27G, and the blue filter 27B may be arranged side by side with each other. A region in which the color filters 27 are formed may correspond to the pixels P described above. A region in which the red filter 27R is formed may correspond to the PR, a region in which the green filter 27G is formed may correspond to the PG, and a region in which the blue filter 27B is formed may correspond to the PB.

The pixel electrode 23 may be provided on an inner side of the first transparent substrate 22, and the common electrode 26 may be provided on an inner side of the second transparent substrate 28.

The pixel electrode 23 and the common electrode 26 may be formed of an electrically conductive metallic material, and may generate an electric field to change the arrangement of liquid crystal molecules 25a forming the liquid crystal layer 25, which will be described below.

The pixel electrode 23 and the common electrode 26 may be formed of a transparent material and may allow light incident from the outside to pass through. For example, the pixel electrode 23 and the common electrode 26 may include indium tin oxide (ITO), indium zinc oxide (IZO), silver nanowire (Ag nanowire), carbon nanotube (CNT), graphene, 3, 4-ethylenedioxythiophene (PEDOT), or the like.

The TFT 24 may be provided on the inner side of the first transparent substrate 22.

The TFT 24 may pass or block current flowing to the pixel electrode 23. For example, an electric field may be created or removed between the pixel electrode 23 and the common electrode 26 in response to turning-on (closing) or turning-off (opening) of the TFT 24.

The TFT 24 may be formed of polysilicon and may be formed by a semiconductor process, such as lithography, deposition, or ion implantation.

The liquid crystal layer 25 may be formed between the pixel electrode 23 and the common electrode 26, and the liquid crystal layer 25 may be filled with liquid crystal molecules 25a.

A liquid crystal may represent an intermediate state between a solid (crystal) and a liquid. Most of the liquid crystal materials may be organic compounds, and the molecular shape thereof may be a slender, long rod. In addition, the arrangement of the molecules may be irregular in some directions, but in other directions they may have the shape of regular crystals. As a result, liquid crystals may have both the fluidity of a liquid and the optical anisotropy of a crystal (solid).

Furthermore, liquid crystals may exhibit optical properties in response to changes in the electric field. For example, in liquid crystals, the direction of the arrangement of the molecules constituting the liquid crystal may change in response to changes in the electric field. When an electric field is generated in the liquid crystal layer 25, the liquid crystal molecules 25a of the liquid crystal layer 25 may be arranged depending on the direction of the electric field. When an electric field is not generated in the liquid crystal layer 25, the liquid crystal molecules 25a may be arranged irregularly or along an alignment film. As a result, the optical properties of the liquid crystal layer 25 may vary depending on the presence or absence of an electric field passing through the liquid crystal layer 25.

On one side of the display panel 20, cables 20a that transmit image data to the display panel 20, and a display driver integrated circuit (DDI) 30 (hereinafter referred to as a driver IC) that processes digital image data and outputs an analog image signal may be provided.

The cables 20a may provide an electrical connection between the control assembly 50/power assembly 60 and the driver ICs 30, and may also provide an electrical connection between the driver ICs 30 and the display panel 20. The cables 20a may include a flexible flat cable, a film cable, or the like.

The driver ICs 30 may receive image data and power from the control assembly 50/power assembly 60 via the cables 20a, and may transmit the image data and drive current to the display panel 20 via the cables 20a.

In addition, the cables 20a and the driver ICs 30 may be integrally implemented as a film cable, chip on film (COF), a tape carrier package (TCP), or the like. In other words, the driver ICs 30 may be disposed on the cables 20b, but the driver ICs 30 are not limited thereto. The driver ICs 30 may be disposed on the display panel 20.

The control assembly 50 may include a control circuit to control the operation of the display panel 20 and the light source device 100. The control circuit may process the image data received from an external content source, transmit the image data to the display panel 20, and transmit dimming data to the light source device 100.

The power assembly 60 may supply power to the display panel 20 and the light source device 100 such that the light source device 100 outputs surface light and the display panel 20 blocks or passes light from the light source device 100.

The control assembly 50 and the power assembly 60 may be implemented as a PCB and various circuits mounted on the PCB. For example, the power circuitry may include a condenser, a coil, a resistor, a processor, and the like, and a power circuit board on which they are mounted. In addition, the control circuitry may include a memory, a processor, and a control circuit board on which they are mounted.

Figure 4:
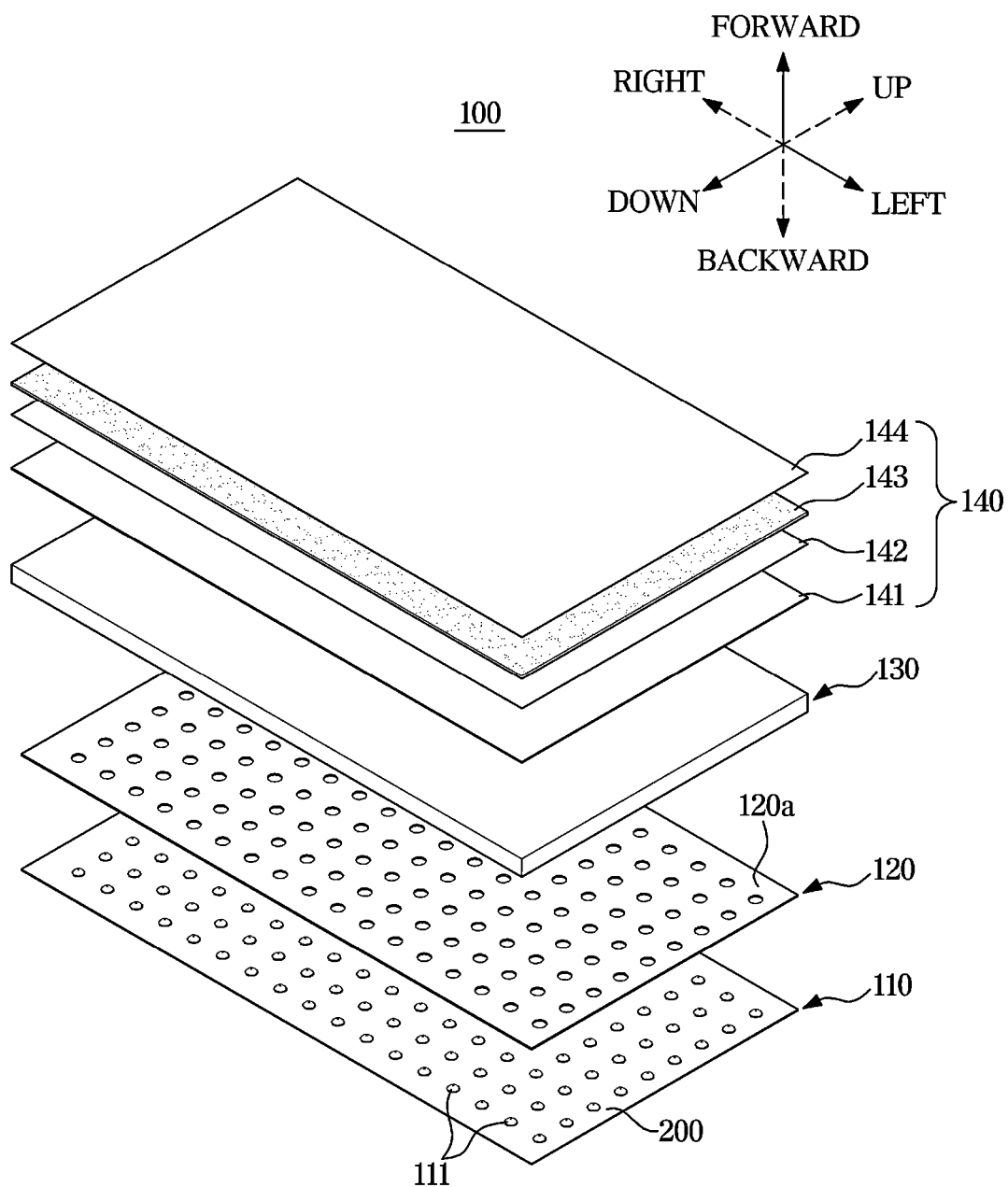
FIG. 4 is an exploded view of a light source device shown in FIG. 2 according to an embodiment.
Figure 5:
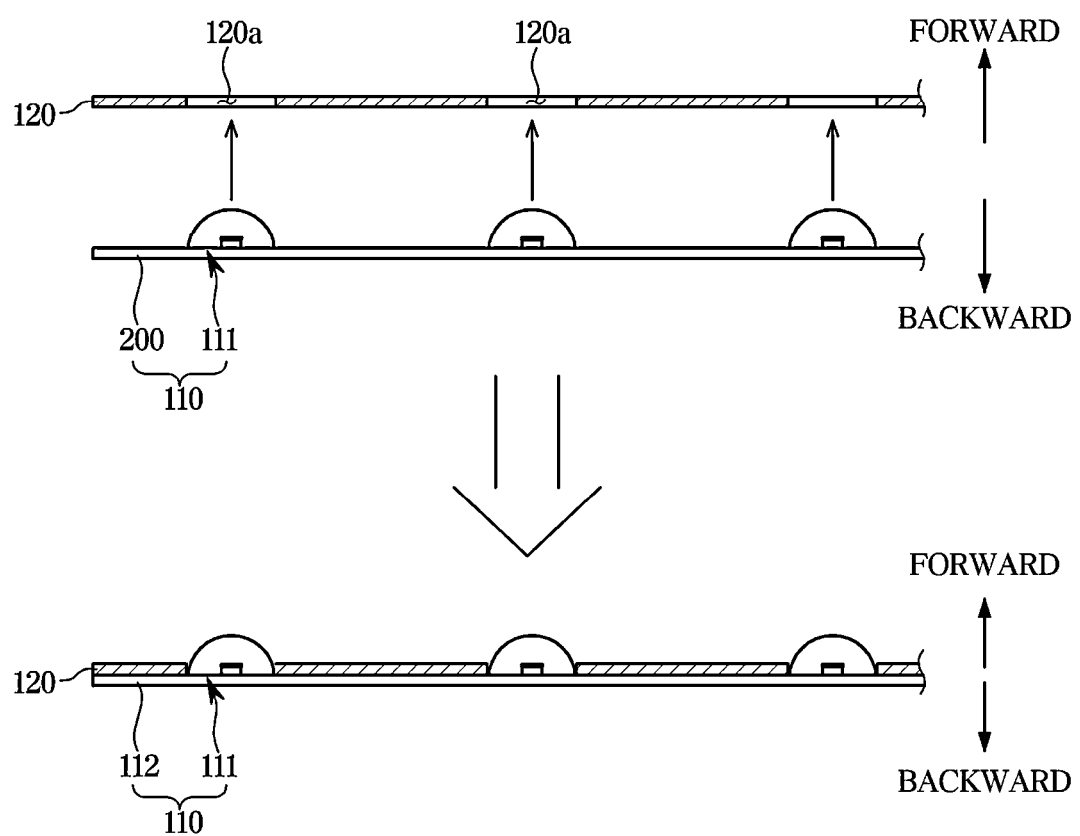
FIG. 5 is a view illustrating coupling of a light source module and a reflective sheet included in the light source device shown in FIG. 4 according to an embodiment.

FIG. 4 is an exploded view of the light source device shown in FIG. 2. FIG. 5 is a view illustrating coupling of a light source module and the reflective sheet included in the light source device shown in FIG. 4.

The light source device 100 may include a light source module 110 that generates light, the reflective sheet 120 that reflects light, the diffuser plate 130 that uniformly diffuses light, and the optical sheet 140 that enhances the luminance of the emitted light.

The light source module 110 may be disposed on a rear side of the display panel 20. The light source module 110 may include a plurality of light sources 111 that emit light, and a PCB 200 that supports/fixes the plurality of light sources 111.

The plurality of light sources 111 may be arranged in a predetermined pattern such that light is emitted with a uniform luminance. The plurality of light sources 111 may be arranged such that a distance between one light source and adjacent light sources is the same.

For example, as shown in FIG. 4, the plurality of light sources 111 may be arranged in rows and columns. Accordingly, the plurality of light sources may be arranged such that an approximately square shape is formed by four adjacent light sources. Furthermore, one light source may be arranged adjacent to the four light sources, and the distance between one light source and the four adjacent light sources may be approximately the same.

In another example, the plurality of light sources may be arranged in a plurality of rows, and one light source belonging to each row may be positioned at the center of two light sources belonging to adjacent rows. Accordingly, the plurality of light sources may be arranged such that an approximately equilateral triangle is formed by the three adjacent light sources. In this case, one light source may be arranged adjacent to six light sources, and the distance between one light source and the six adjacent light sources may be approximately the same.

However, the pattern in which the plurality of light sources 111 are arranged is not limited to the patterns described above, and the plurality of light sources 111 may be arranged in various patterns to enable light to be emitted with uniform luminance.

The light sources 111 may employ elements that, when energized, may emit monochromatic light (light of a specific wavelength, e.g., blue light) or white light (e.g., a mixture of red, green, and blue light) in various directions. For example, each light source 111 may include a LED.

The PCB 200 may fix the plurality of light sources 111 such that the positions of the light sources 111 do not change. In addition, the PCB 200 may supply power to each of the light sources 111 for the light sources 111 to emit light.

The PCB 200 may be formed of a synthetic resin or tempered glass or a PCB with conductive power supply lines formed to fix the plurality of light sources 111 and to supply power to the light sources 111.

The reflective sheet 120 may reflect light emitted from the plurality of light sources 111 in a forward or in a direction proximate to the front.

A plurality of through holes 120a may be formed in the reflective sheet 120 at positions corresponding to each of the plurality of light sources 111 of the light source module 110. In addition, the light sources 111 of the light source module 110 may pass through the through holes 120a and protrude forward of the reflective sheet 120.

For example, as shown in the upper side of FIG. 5, during the assembly process of the reflective sheet 120 and the light source modules 110, the plurality of light sources 111 of the light source module 110 may be inserted into the plurality of the through holes 120a formed in the reflective sheet 120. Accordingly, as shown in the lower side of FIG. 5, the PCB 200 of the light source module 110 is positioned on a rear side of the reflective sheet 120, but the plurality of light sources 111 of the light source module 110 may be positioned on a front side of the reflective sheet 120.

As a result, the plurality of light sources 111 may emit light from the front side of the reflective sheet 120.

The plurality of light sources 111 may emit light in various directions from the front side of the reflective sheet 120. Light may be emitted from the light sources 111 toward the diffuser plate 130 as well as from the light sources 111 toward the reflective sheet 120, and the reflective sheet 120 may reflect the light emitted toward the reflective sheet 120 toward the diffuser plate 130.

Light emitted from the light sources 111 may pass through various objects, such as the diffuser plate 130 and the optical sheet 140. As the light passes through the diffuser plate 130 and the optical sheet 140, a portion of the incident light may be reflected from the surfaces of the diffuser plate 130 and the optical sheet 140. The reflective sheet 120 may reflect the light reflected from the diffuser plate 130 and the optical sheet 140.

The diffuser plate 130 may be positioned on a front side of the light source module 110 and the reflective sheet 120, and may uniformly distribute the light emitted from the light sources 111 of the light source module 110.

As described above, the plurality of light sources 111 may be positioned anywhere on a rear surface of the light source device 100. Although the plurality of light sources 111 are arranged at equal intervals on the rear surface of the light source device 100, unevenness in luminance may occur depending on the positions of the plurality of light sources 111.

The diffuser plate 130 may diffuse the light emitted from the plurality of light sources 111 within the diffuser plate 130 in order to eliminate the unevenness of the luminance caused by the plurality of light sources 111. In other words, the diffuser plate 130 may uniformly emit the uneven light from the plurality of light sources 111 to the front surface thereof.

The optical sheet 140 may include a variety of sheets to improve the luminance and the evenness of luminance. For example, the optical sheet 140 may include a diffuser sheet 141, a first prism sheet 142, a second prism sheet 143, a reflective polarizing sheet 144, and the like.

The diffuser sheet 141 may diffuse light for uniformity of luminance. The light emitted from the light source 111 may be diffused by the diffuser plate 130 and may be diffused again by the diffuser sheet 141 included in the optical sheet 140.

The first and second prism sheets 142 and 143 may increase the luminance by concentrating the light diffused by the diffuser sheet 141. The first and second prism sheets 142 and 143 may include a prism pattern in the shape of a triangular prism, wherein a plurality of prism patterns may be arranged adjacent to each other to form a plurality of strip shapes.

The reflective polarizing sheet 144 may be a type of polarizing film and may transmit a portion of the incident light and reflect other portions to enhance luminance. For example, the reflective polarizing sheet 144 may transmit polarized light in the same direction as a predetermined polarization direction of the reflective polarizing sheet 144, and reflect polarized light in a direction different from the polarization direction of the reflective polarizing sheet 144. In addition, the light reflected by the reflective polarizing sheet 144 may be recycled within the light source device 100, and the luminance of the display device 10 may be improved by such light recycling.

The optical sheet 140 is not limited to the sheet or film shown in FIG. 4 and may include a variety of other sheets or films, such as a protective sheet.

Figure 6:
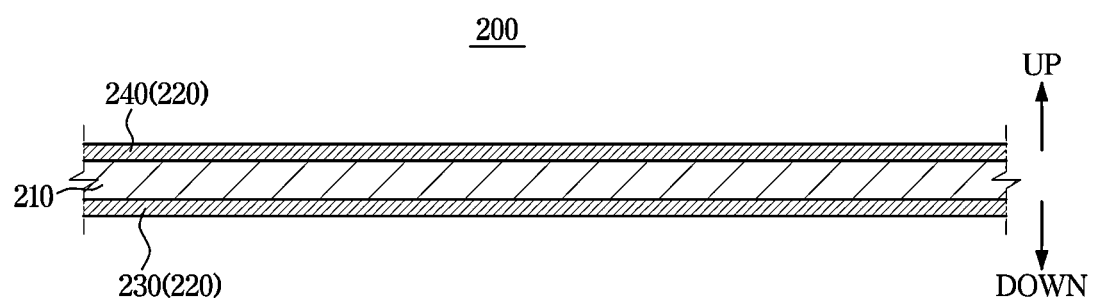
FIG. 6 is a schematic cross-sectional view of a printed circuit board illustrated in FIG. 4 according to an embodiment.

FIG. 6 is a cross-sectional view schematically showing the PCB shown in FIG. 4.

As shown in FIG. 6, the PCB 200 may include an insulating layer 210 that is a non-conductive, and a conductive layer 220 that is conductive. The conductive layer 220 may include a first conductive layer 230 formed on a lower surface of the insulating layer 210 and a second conductive layer 240 formed on an upper surface of the insulating layer 210.

A line or pattern through which power and/or electrical signals pass may be formed in the conductive layers 220. The conductive layers 220 may be formed from a variety of materials that are electrically conductive. For example, the conductive layers 220 may include a variety of metallic materials, such as copper (Cu), tin (Sn), aluminum (Al), or alloys thereof. In the present disclosure, the conductive layer 220 may include copper. Accordingly, the conductive layer 220 may be referred to as a copper foil layer.

The dielectric of the insulating layer 210 may insulate between the lines or patterns of the conductive layer 220. The insulating layer 210 may include a dielectric for electrical insulation, for example, FR-4.

Figure 7:
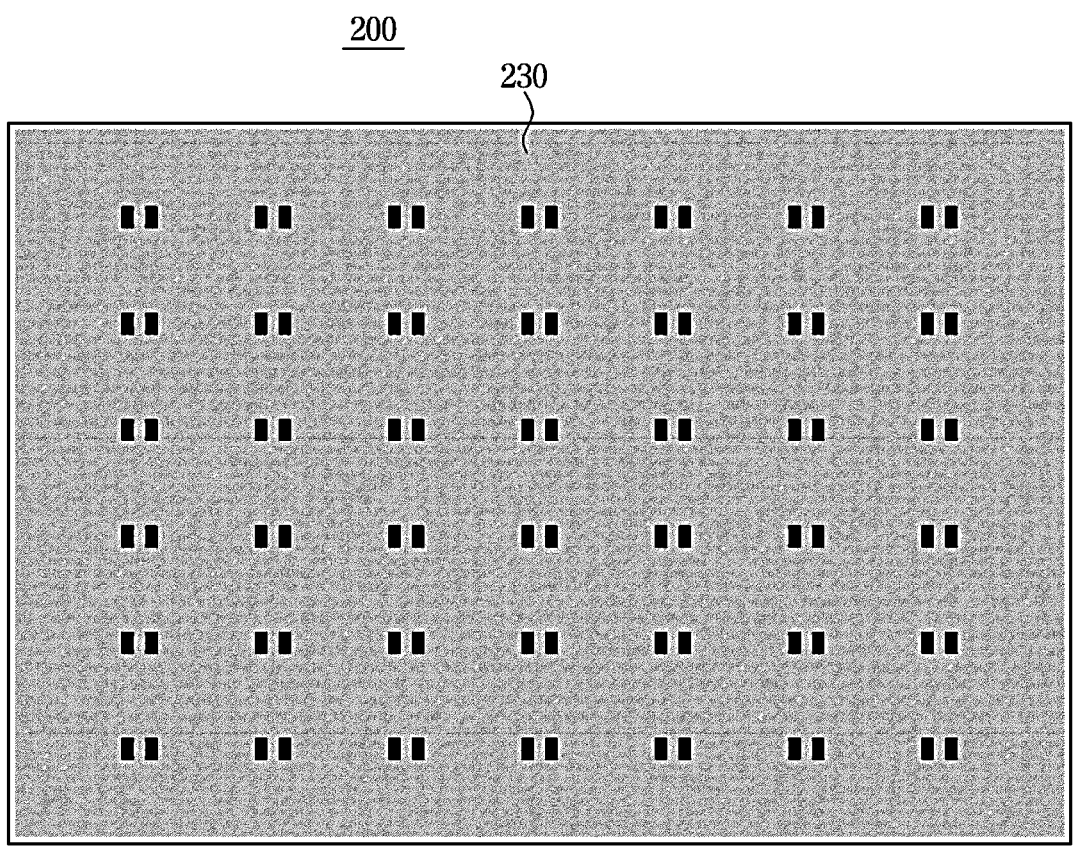
FIG. 7 is a schematic view of a lower surface of the printed circuit board shown in FIG. 6 according to an embodiment.
Figure 8:
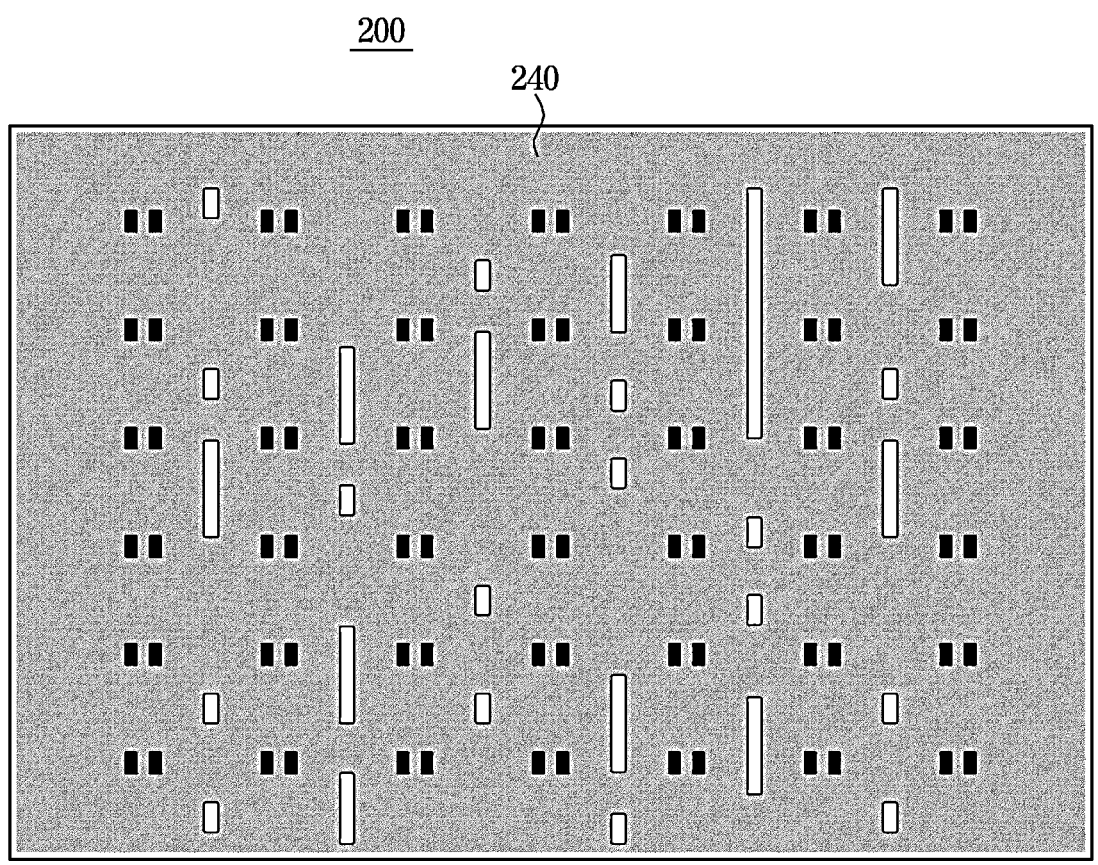
FIG. 8 is a schematic view of an upper surface of the printed circuit board shown in FIG. 6 according to an embodiment.
Figure 9:
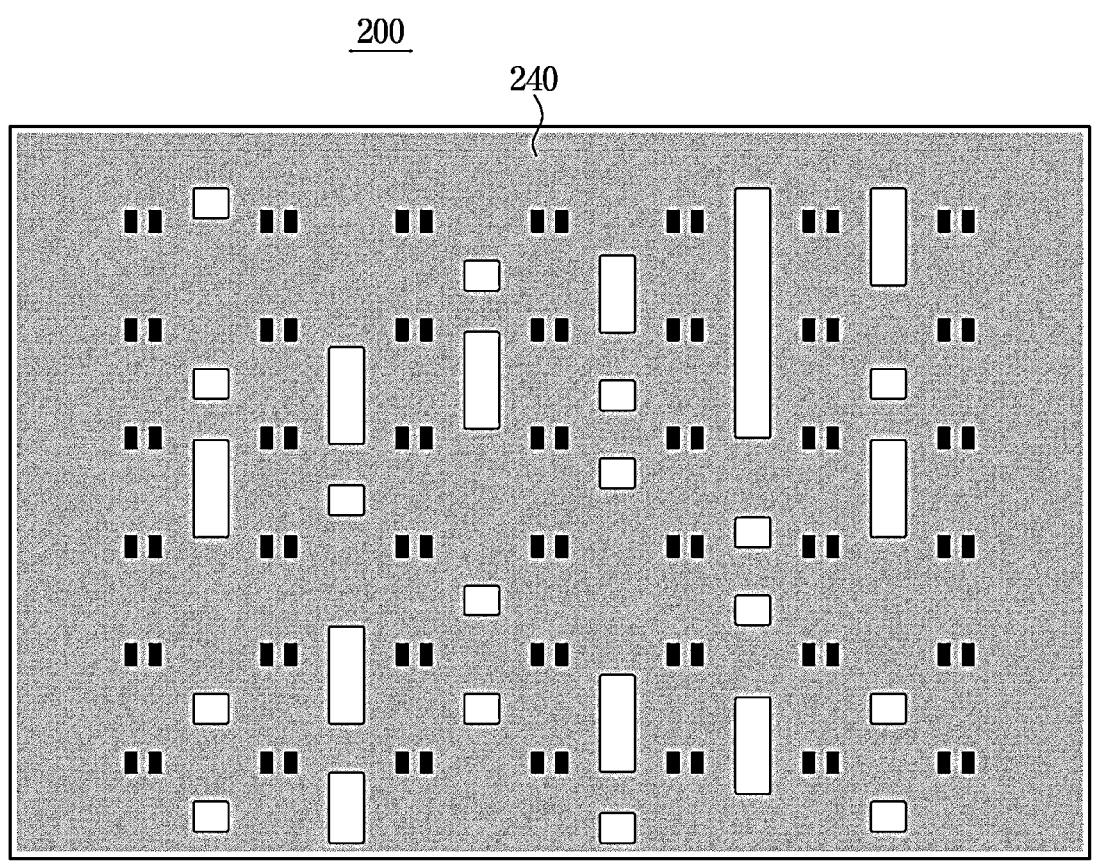
FIG. 9 is a schematic view of a cut-out of a portion of an area of a second conductive layer formed on the upper surface of the printed circuit board shown in FIG. 8 according to an embodiment.

FIG. 7 is a schematic view of a lower surface of the PCB shown in FIG. 6. FIG. 8 is a schematic view of an upper surface of the PCB shown in FIG. 6. FIG. 9 is a schematic view showing a cut-out of a portion of an area of a second conductive layer formed on the upper surface of the PCB shown in FIG. 8.

As shown in FIG. 7, the first conductive layer 230 may be formed on the lower surface of the PCB 200. The first conductive layer 230 may be formed to occupy approximately 90% of the area of the lower surface of the PCB 200.

As shown in FIG. 8, the second conductive layer 240 may be formed on the upper surface of the PCB 200. The second conductive layer 240 may be cover approximately 83% of the area of the upper surface of the PCB 200. A portion or portions of the second conductive layer 240 may be cut out so that a remaining portion of the second conductive layer 240 occupies only 83% of the area of the upper surface of the PCB 200.

As shown in FIG. 9, the second conductive layer 240 formed on the upper surface of the PCB 200 may be cover approximately 77% of the area of the upper surface of the PCB 200. In order for the second conductive layer 240 to occupy only 77% of the area of the upper surface of the PCB 200, a portion or portions of the area of the second conductive layer 240 shown in FIG. 8 may be further cut out.

As shown in FIGS. 7 to 9, the area of the first conductive layer 230 formed on the lower surface of the PCB 200 and the area of the second conductive layer 240 formed on the upper surface of the PCB 200 may be formed differently. In other words, the second conductive layer 240 may be formed such that the area of the second conductive layer 240 is smaller than that of the first conductive layer 230. The second conductive layer 240 may be cover 70% to 90% of the area of the upper surface of the PCB 200.

The PCB 200 may be bent and distorted due to thermal expansion after the reflow process for surface mount technology (SMT). Accordingly, the areas of the first conductive layer 230 and the second conductive layer 240 may be formed differently to induce the PCB 200 to bend uniformly in one direction. The PCB 200 may have different thermal expansion rates depending on the areas of the first conductive layer 230 and the second conductive layer 240 formed on the lower and upper surfaces. In other words, the thermal expansion rate of the insulating layer 210 may be higher than that of the conductive layers 220. Accordingly, when the PCB 200 is bent due to thermal expansion after the reflow process, the smaller the area occupied by the conductive layer 220 or the larger the area occupied by the insulating layer 210, the more it may expand.

Figure 10:
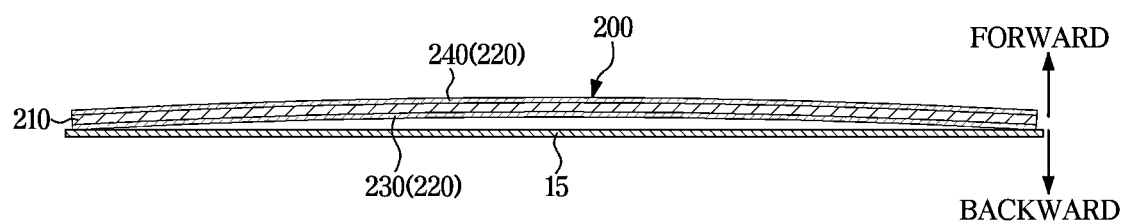
FIG. 10 is a view illustrating the printed circuit board assembled on a bottom chassis being bent due to thermal expansion, according to an embodiment.

FIG. 10 is a view illustrating the PCB assembled on the bottom chassis being bent due to thermal expansion, according to an embodiment.

As shown in FIGS. 7 to 9, when the area of the second conductive layer 240 is formed to have an area smaller than that of the first conductive layer 230, the upper surface of the PCB 200 may expand more than the lower surface. When the upper surface of the PCB 200 expands more than the lower surface, as shown in FIG. 10, a central portion of the PCB 200 may be bent in a direction toward the display panel 20 (see FIG. 2), which is opposite to a direction toward the bottom chassis, and an edge portion thereof may be bent in the direction toward the bottom chassis 15.

As described above, by guiding the PCB 200 to be bent uniformly in one direction, distortion of the PCB 200 may be prevented. By preventing distortion of the PCB 200, a uniform image quality may be produced on the display panel 20 (see FIG. 2). In addition, by preventing distortion of the PCB 200, mura that occurs at the plate boundaries due to distortion of the PCB 200 when the PCB 200 is assembled on the bottom chassis 15 may be improved.

According to one or more embodiments, the display device may prevent distortion by allowing the PCB to bend uniformly in one direction due to thermal expansion.

Further, according to one or more embodiments, the display device may prevent distortion of the PCB, thereby ensuring uniform image quality.

Further, according to one or more embodiments, the display device may prevent distortion of the PCB, thereby improving mura that occurs at the plate boundary due to distortion of the PCB when the PCB is assembled to a bottom chassis.

The above-described embodiments are merely specific examples to describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. A display device comprising:
   a display panel;
   a light source module on a rear side of the display panel and configured to generate light supplied to the display panel, the light source module comprising a plurality of light sources configured to emit light and a printed circuit board (PCB) on which the plurality of light sources are provided; and
   a bottom chassis on a rear side of the light source module and on which the light source module is provided,
   wherein the PCB comprises:
      an insulating layer,
      a first conductive layer on a lower surface of the insulating layer, and
      a second conductive layer on an upper surface of the insulating layer, and
   wherein an area of the second conductive layer is smaller than an area of the first conductive layer, and the PCB is convexly bent in a direction toward the display panel.

2. The display device of claim 1, wherein a central portion of the PCB is bent toward the display panel and an edge portion of the PCB is bent toward the bottom chassis.

3. The display device of claim 1, wherein each of the first conductive layer and the second conductive layer comprises copper.

4. The display device of claim 1, wherein the first conductive layer forms 90% of an area of a lower surface of the PCB.

5. The display device of claim 4, wherein the second conductive layer forms 70% to 90% of an area of an upper surface of the PCB.

6. The display device of claim 5, wherein the second conductive layer forms 77% of the area of the upper surface of the PCB.

7. The display device of claim 5, wherein the second conductive layer forms 83% of the area of the upper surface of the PCB.

8. The display device of claim 1, wherein at least a portion of the second conductive layer is cut away such that an area of a remaining portion of the second conductive layer is smaller than the area of the first conductive layer.

* * * * *